(12) United States Patent
Miyahara et al.

(10) Patent No.: US 12,532,503 B2
(45) Date of Patent: Jan. 20, 2026

(54) SILICON CARBIDE SEMICONDUCTOR DEVICE

(71) Applicant: DENSO CORPORATION, Kariya (JP)

(72) Inventors: Shinichiro Miyahara, Kariya (JP); Shoji Mizuno, Kariya (JP)

(73) Assignee: DENSO CORPORATION, Kariya (JP)

( * ) Notice: Subject to any disclaimer, the term of this patent is extended or adjusted under 35 U.S.C. 154(b) by 704 days.

(21) Appl. No.: 17/840,083

(22) Filed: Jun. 14, 2022

(65) Prior Publication Data
US 2022/0406932 A1    Dec. 22, 2022

(30) Foreign Application Priority Data
Jun. 16, 2021    (JP) .................................. 2021-100264

(51) Int. Cl.
| | |
|---|---|
| *H10D 30/66* | (2025.01) |
| *H10D 12/01* | (2025.01) |
| *H10D 62/10* | (2025.01) |
| *H10D 62/17* | (2025.01) |
| *H10D 62/832* | (2025.01) |
| *H10D 89/60* | (2025.01) |

(52) U.S. Cl.
CPC ......... *H10D 30/668* (2025.01); *H10D 12/031* (2025.01); *H10D 62/127* (2025.01); *H10D 62/393* (2025.01); *H10D 62/8325* (2025.01); *H10D 89/611* (2025.01)

(58) Field of Classification Search
CPC .. H10D 30/668; H10D 12/031; H10D 12/481; H10D 62/127; H10D 62/393; H10D 62/8325; H10D 62/111; H10D 62/157; H10D 89/611; H10D 84/143
See application file for complete search history.

(56) References Cited

U.S. PATENT DOCUMENTS

| | | | |
|---|---|---|---|
| 2009/0294870 A1 | 12/2009 | Arai | |
| 2012/0080728 A1* | 4/2012 | Malhan | H10D 64/411 257/280 |
| 2012/0319136 A1* | 12/2012 | Noborio | H10D 12/038 257/77 |
| 2016/0365294 A1* | 12/2016 | Mori | H01L 23/34 |
| 2017/0111037 A1* | 4/2017 | Shiigi | H10D 84/401 |

(Continued)

FOREIGN PATENT DOCUMENTS

JP    2020-109808 A    7/2020

*Primary Examiner* — Fernando L Toledo
*Assistant Examiner* — Marshall Mu-Nuo Hatfield
(74) *Attorney, Agent, or Firm* — Posz Law Group, PLC

(57) ABSTRACT

A silicon carbide semiconductor device includes a substrate, a drift layer, a base layer, a first electrode, and a second electrode. The substrate includes a cell region at which a semiconductor element is disposed and a temperature detection region at which a diode element is disposed. The first electrode is disposed at a side facing the substrate with the drift layer sandwiched between the substrate and the first electrode. The second electrode is disposed at a side facing the drift layer with the substrate sandwiched between the drift layer and the second electrode. The semiconductor element includes a first impurity region and a second impurity region disposed at a surface layer portion of the base layer. The diode element includes a first constituent layer at a surface layer portion of the base layer and a second constituent layer connected to the first constituent layer.

8 Claims, 9 Drawing Sheets

(56) References Cited

U.S. PATENT DOCUMENTS

| | | | |
|---|---|---|---|
| 2017/0271457 A1* | 9/2017 | Onogi | H01L 23/34 |
| 2018/0277437 A1* | 9/2018 | Yamada | H10D 84/0126 |
| 2019/0131448 A1* | 5/2019 | Yoshida | H10D 30/665 |
| 2020/0191661 A1* | 6/2020 | Ohoka | H10D 8/00 |
| 2021/0217678 A1* | 7/2021 | Hoshi | H01L 23/34 |

\* cited by examiner

SILICON CARBIDE SEMICONDUCTOR DEVICE

CROSS REFERENCE TO RELATED APPLICATION

This application is based on Japanese Patent Application No. 2021-100264 filed on Jun. 16, 2021, the disclosure of which is incorporated herein by reference.

TECHNICAL FIELD

The present disclosure relates to a silicon carbide (SiC) semiconductor device.

BACKGROUND

A SiC semiconductor device may include a temperature detection element. The SiC semiconductor device may include a semiconductor substrate made of silicon carbide. A semiconductor element such as a Metal Oxide Semiconductor Field Effect Transistor (MOSFET) is formed at the semiconductor substrate.

SUMMARY

The present disclosure describes a silicon carbide semiconductor device including a substrate, a drift layer, and a base layer.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
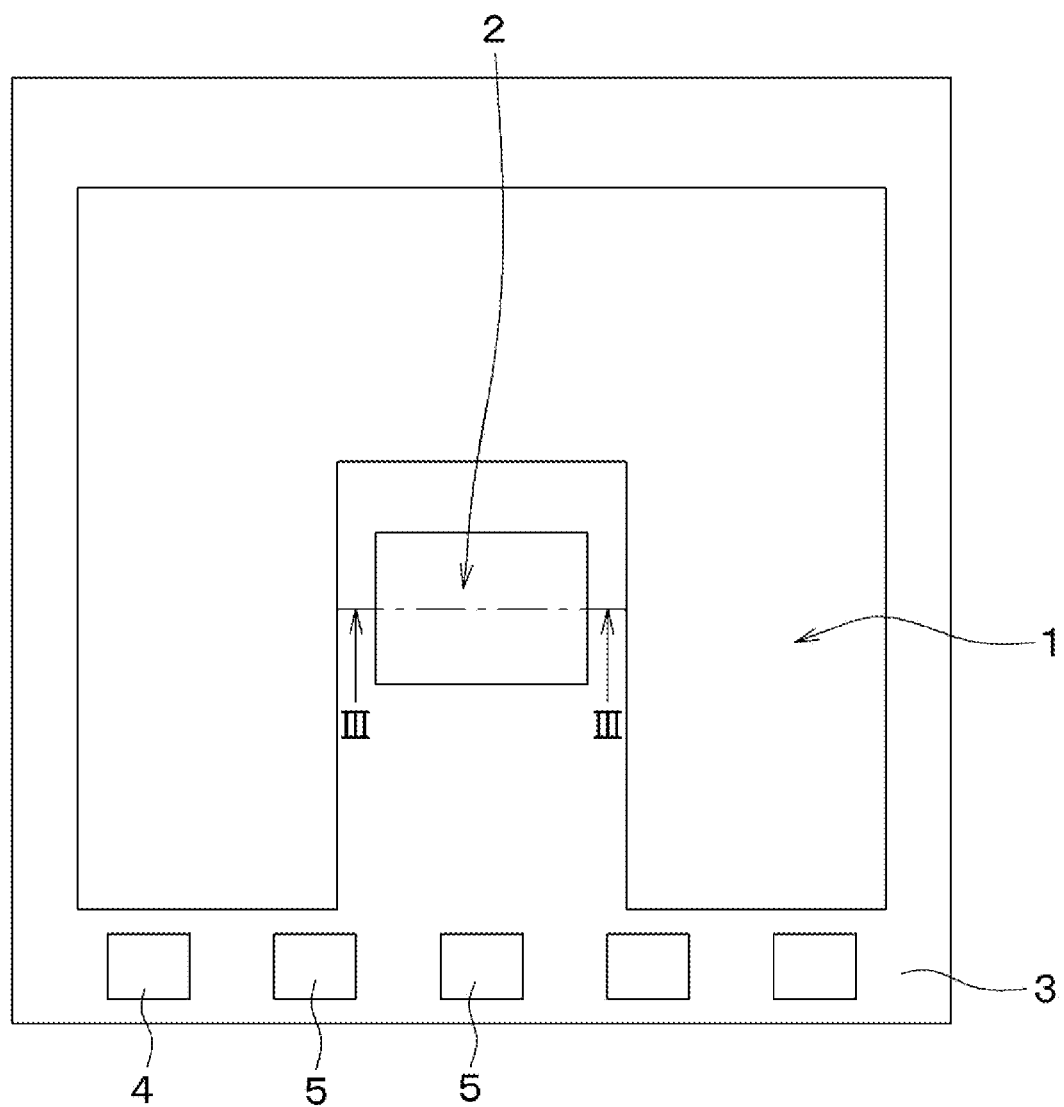
FIG. 1 is a plan view of a SiC semiconductor device according to a first embodiment.

A semiconductor element such as a Metal Oxide Semiconductor Field Effect Transistor (MOSFET) may be formed at a semiconductor substrate included in a silicon carbide (SiC) semiconductor device. A portion of the semiconductor substrate different from the portion where the semiconductor element is formed may be provided with a temperature detection element. The temperature detection element may include a diode element having an n-type cathode layer and a p-type anode layer inside a trench formed at the semiconductor substrate. The temperature detection element may be formed by arranging a cathode layer along a wall surface of the trench and arranging an anode layer inside the cathode layer.

However, in such a SiC semiconductor device, the cathode layer and the anode layer are embedded in order inside the trench to form the temperature detection element. In order to acquire a temperature detection element with desirable diode properties, it may be required to control a film thickness of the cathode layer and a film thickness of the anode layer. Thus, the structure may become complicated and the degree of freedom in designing the SiC semiconductor device is likely to be lower.

According to an aspect of the present disclosure, a silicon carbide semiconductor device includes a substrate, a drift layer, a base layer, a first electrode, and a second electrode. The substrate includes a cell region at which a semiconductor element is disposed and a temperature detection region at which a diode element is disposed. The substrate has a first conductivity type or a second conductivity type, and is made of silicon carbide. The drift layer has the first conductivity type, and the drift layer is disposed above the substrate and has an impurity concentration lower than an impurity concentration of the substrate. The base layer has the second conductivity type, and the base layer is disposed above the drift layer. The first electrode is disposed at a side facing the substrate with the drift layer sandwiched between the substrate and the first electrode, and the first electrode is electrically connected to the semiconductor element included in the cell region. The second electrode is disposed at a side facing the drift layer with the substrate sandwiched between the drift layer and the second electrode, and the second electrode is electrically connected to the semiconductor element included in the cell region. The semiconductor element disposed at the cell region includes a first impurity region and a second impurity region. The first impurity region has the first conductivity type and is disposed at a surface layer portion of the base layer. The second impurity region has the second conductivity type and is disposed at the surface layer portion of the base layer. The first impurity region and the second impurity region are connected to the first electrode. The diode element disposed at the temperature detection region includes a first constituent layer and a second constituent layer. The first constituent layer has the first conductivity type, and is disposed at the surface layer portion of the base layer. The second constituent layer has the second conductivity type and is disposed at the surface layer portion of the base layer. The second constituent layer is connected to the first constituent layer in a plane direction of the substrate.

According to the above configuration, it is possible to simplify the configuration without the need to form a trench, in comparison to the case of arranging the first constituent layer and the second constituent layer inside the trench to form the diode element. Since the first constituent layer and the second constituent layer are formed at the surface layer portion of the base layer, it is possible to easily form the first constituent layer and the second constituent layer through, for example, ion implantation, and easily modify, for example, the impurity concentration and the depth. Therefore, it is possible to enhance the degree of freedom in designing the SiC semiconductor device.

The following describes several embodiments with reference to the drawings. In the following embodiments, the same or equivalent parts are denoted by the same reference numerals as each other, and explanations will be provided to the same reference numerals.

First Embodiment

The following describes a first embodiment with reference to drawings.

In the present embodiment, as illustrated in FIG. 1, a SiC semiconductor device includes a cell region 1, a temperature detection region 2, and a peripheral region 3, and the SiC semiconductor device has an inverted MOSFET with a trench gate structure formed at the cell region 1. FIG. 1 illustrates the temperature detection region 2 is formed at a substantially central portion of a planar layout of the SiC semiconductor device. However, the position where the temperature detection region 2 is formed may be appropriately modified, and may be formed at, for example, an outer edge portion. The peripheral region 3 includes, for example, a pad 4 and a pad 5. The pad 4 is connected to a gate electrode 26 described hereinafter, and the pad 5 is connected to a diode element 40 described hereinafter.

Figure 2:
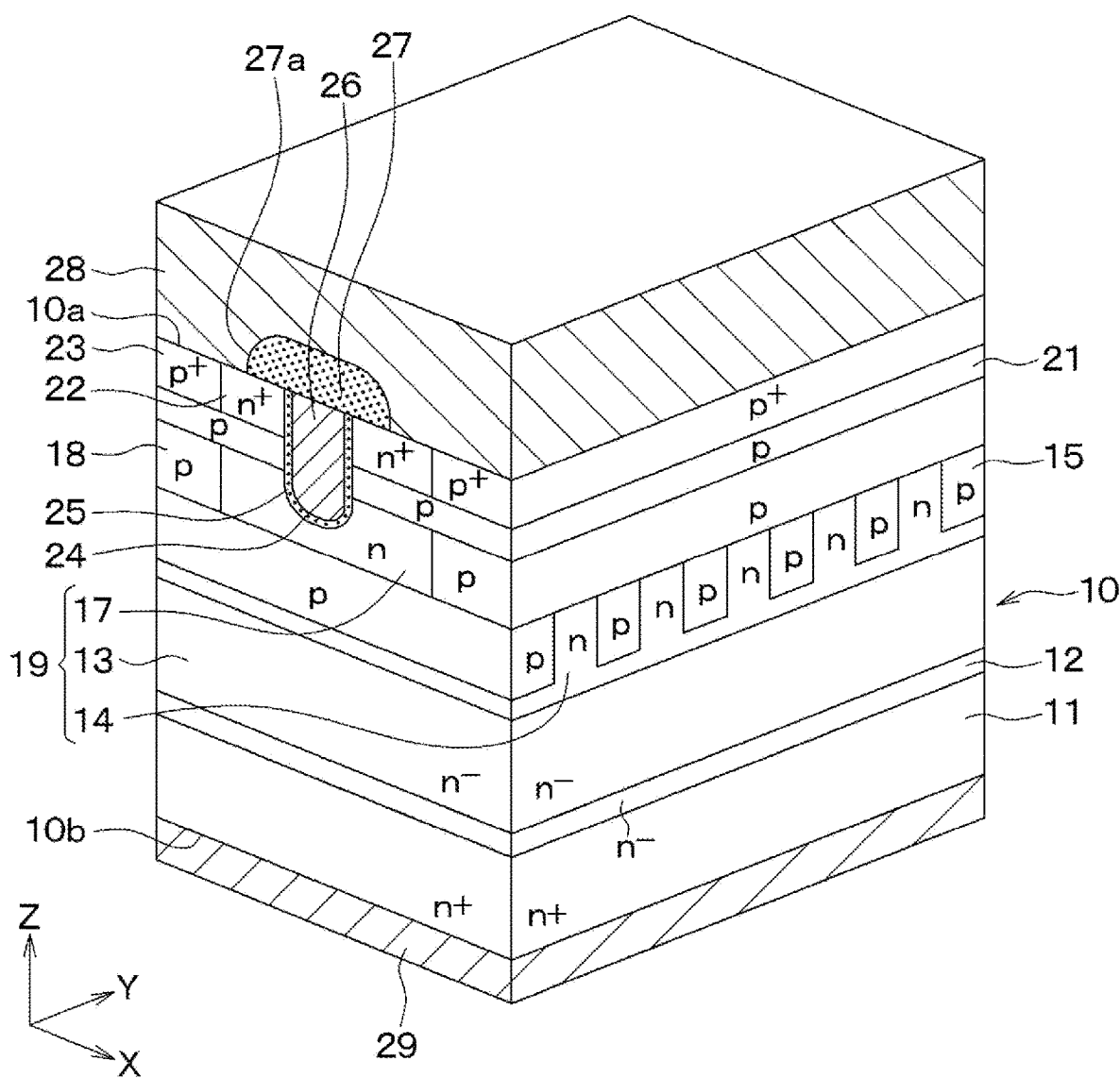
FIG. 2 is a cross-sectional perspective view of a cell region.
Figure 3:
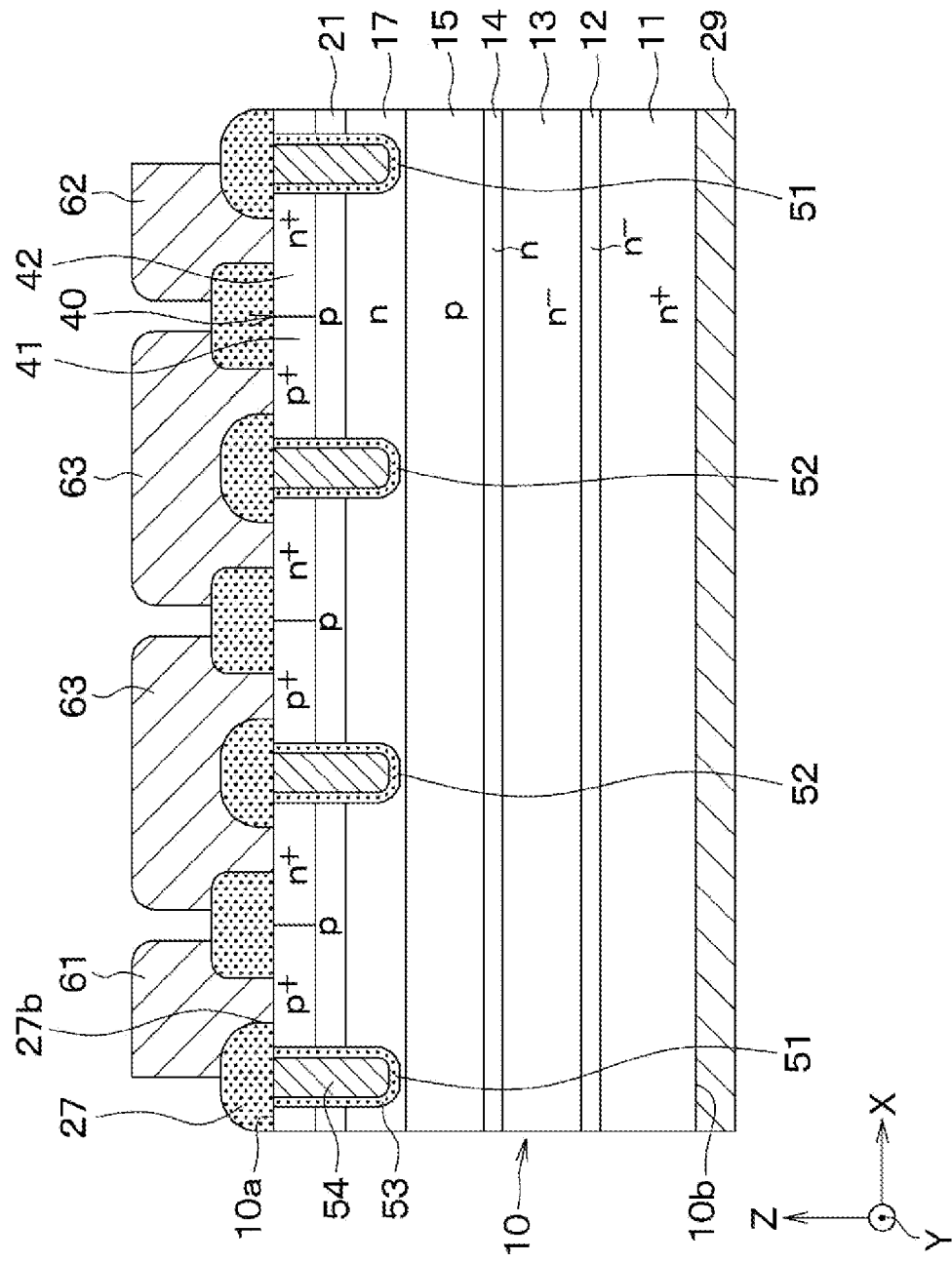
FIG. 3 is a cross-sectional view of a temperature detection region taken along a line III-III shown in FIG. 1.

In the following, as illustrated in FIGS. 2, 3, one of directions included in a planar direction of a substrate 11 described hereinafter is defined as the X-axis direction, and another one of the directions included in the planar direction of the substrate 11 and orthogonal to the X-axis direction is defined as the Y-axis direction. The direction orthogonal to the Y-axis direction and the X-axis direction is defined as the Z-axis direction. In the present embodiment, the X-axis direction is orthogonal to the Y-axis direction. For example, the left-right direction in the drawing of FIG. 3 corresponds to the X-axis direction, the depth direction in the drawing of FIG. 3 corresponds to the Y-axis direction, and the up-down direction in the drawing of FIG. 3 corresponds to the Z-axis direction. The planar direction described in the present disclosure may also be referred to as a plane direction.

As illustrated in FIGS. 2, 3, the SiC semiconductor device includes a semiconductor substrate 10. The SiC semiconductor device includes an $n^+$-type substrate 11 made of SiC. In the present embodiment, the substrate 11 has an off-angle of 0 to 8 degrees with respect to, for example, a (0001) Si plane, and the substrate 11 has an n-type impurity concentration of, for example, $1.0 \times 10^{19}/cm^3$, such as nitrogen or phosphorus, and a thickness of about 300 micrometers (μm). In the present embodiment, the substrate 11 forms a drain region.

An $n^-$ type buffer layer 12 made of SiC is formed above a surface of the substrate 11. The buffer layer 12 is formed by epitaxial growth on the surface of the substrate 11. The buffer layer 12 has an n-type impurity concentration between the impurity concentration of the substrate 11 and the impurity concentration of a low-concentration layer 13, and has a thickness of 1 μm.

The $n^-$-type low-concentration layer 13 made of SiC having an n-type impurity concentration of, for example, $5.0 \times 10^{15}/cm^3$ to $10.0 \times 10^{15}/cm^3$ and a thickness of about 10 μm to 15 μm is formed on a surface of the buffer layer 12. The low-concentration layer 13 may have a constant impurity concentration along the Z-axis direction. However, the concentration distribution may be inclined so that the concentration of a portion of the low-concentration layer 13 closer to the substrate 11 is higher than the concentration of the other portions of the low-concentration layer 13 farther from the substrate 11. For example, the low-concentration layer 13 may have the impurity concentration of a portion separated by about 3 μm to 5 μm from the surface of the substrates 11 higher than that of other portions by about $2.0 \times 10^{15}/cm^3$. With the configuration described above, an internal resistance of the low-concentration layer 13 can be reduced, and an on-resistance can be reduced.

The cell region 1 according to the present embodiment has the following parts above the low-concentration layer 13. As illustrated in FIG. 2, in the cell region 1, a Junction Field-Effect Transistor (JFET) portion 14 and a first deep layer 15 are formed at a surface layer portion of the low-concentration layer 13. In the present embodiment, the JFET portion 14 and the first deep layer 15 extend along the X-axis direction, and respectively have linear portions arranged alternately and repeatedly along the Y-axis direction. The JFET portion 14 and the first deep layer 15 respectively have stripe shapes extending along the X-axis direction in a direction normal to the surface of the substrate 11 (hereinafter simply referred to as a normal direction). The JFET portion 14 and the first deep layer 15 respectively have layouts aligned alternately along the Y-axis direction. The description "in the direction normal to the surface of the substrate 11" may refer to the description "as viewed in a direction normal to the surface of the substrate 11" or the description "as viewed in the Z-axis direction".

The JFET portion 14 has an n-type impurity concentration higher than the low-concentration layer 13, and has a depth of 0.3 μm to 0.5 μm. In the present embodiment, the JFET portion 14 has an n-type impurity concentration of $7.0 \times 10^{16}/cm^3$ to $5.0 \times 10^{17}/cm^3$. For example, the first deep layer 15 has a p-type impurity such as boron with the concentration of $2.0 \times 10^{17}/cm^3$ to $2.0 \times 10^{18}/cm^3$.

The first deep layer 15 according to the present embodiment is formed shallower than the JFET portion 14. In other words, the first deep layer 15 is formed such that the bottom portion of the first deep layer 15 is located inside the JFET portion 14. In other words, the first deep layer 15 is formed such that the JFET portion 14 is located between the first deep layer 15 and the low-concentration layer 13.

A current dispersion layer 17 and a second deep layer 18 are formed above the JFET portion 14 and the first deep layer 15. The current dispersion layer 17 has an n-type impurity layer and has a thickness of 0.5 μm to 2 μm. The current dispersion layer 17 has an n-type impurity concentration of, for example, $1.0 \times 10^{16}/cm^3$ to $5.0 \times 10^{17}/cm^3$. The current dispersion layer 17 is connected to the JFET portion 14. In the present embodiment, the low-concentration layer 13, the JFET portion 14, and the current dispersion layer 17 are connected, and a drift layer 19 is formed by the low-concentration layer 13, the JFET portion 14, and the current dispersion layer 17.

For example, the second deep layer 18 has a p-type impurity concentration of $2.0 \times 10^{17}/cm^3$ to $2.0 \times 10^{18}/cm^3$. The second deep layer 18 is formed to be connected to the first deep layer 15.

The current dispersion layer 17 and the second deep layer 18 respectively extend in a direction intersecting a part of the JFET portion 14 having the stripe shape and in a direction intersecting the lengthwise direction of the first deep layer 15. In the present embodiment, the current dispersion layer 17 and the second deep layer 18 respectively extend along the Y-axis direction as the lengthwise direction, and respectively have multiple portions alternately aligned along the X-axis direction. The formation pitch of the current dispersion layer 17 and the second deep layer 18 corresponds to the formation pitch of the trench gate structure, and the second deep layer 18 is formed to sandwich a gate trench 24 described hereinafter.

A p-type base layer 21 is formed above the current dispersion layer 17 and the second deep layers 18. An $n^+$-type source region 22 and a $p^+$-type contact region 23 are formed at a surface layer portion of the base layer 21. The source region 22 is formed to be in contact with a side surface of the gate trench 24, and the contact region 23 is formed to be at a side opposed to the gate trench 24 to sandwich the source region 22. In the present embodiment, the source region 22 corresponds to a first impurity region, and the contact region 23 corresponds to a second impurity region.

The base layer 21 has, for example, a p-type impurity concentration of $3.0 \times 10^{17}/cm^3$ or lower. The source region 22 has an n-type impurity concentration at the surface layer portion, in other words, a surface concentration of, for example, $1.0 \times 10^{21}/cm^3$. The contact region 23 has a p-type impurity concentration at the surface layer portion, in other words, a surface concentration of, for example, $1.0 \times 10^{21}/cm^3$.

In the present embodiment, as described above, in the cell region 1, the substrate 11, the buffer layer 12, the low-concentration layer 13, the JFET portion 14, the first deep layer 15, the current dispersion layer 17, the second deep layer 18, the base layer 21, the source region 22, the contact region 23 or the like are stacked to form the semiconductor substrate 10. In the following, the surface of the semiconductor substrate 10 closer to the substrate 11 is referred to as a second surface 10b of the semiconductor substrate 10, and the surface of the semiconductor substrate 10 closer to the source region 22 and the contact region 23 is referred to as a first surface 10a of the semiconductor substrate 10. The source region 22 and the contact region 23 are exposed from the first surface 10a of the semiconductor substrate 10.

The gate trench 24 is formed from the first surface 10a of the semiconductor substrate 10 so as to penetrate, for example, the base layer 21 and reach the current dispersion layer 17. The bottom surface of the gate trench 24 is located inside the current dispersion layer 17. The gate trench 24 is formed not to reach the JFET portion 14 and the first deep layer 15. In other words, the gate trench 24 is formed such that the JFET portion 14 and the first deep layer 15 are located below the bottom surface of the gate trench 24.

Multiple gate trenches 24 respectively extend along the Y-axis direction, and respectively have stripe shapes aligned at equal intervals along the X-axis direction. In the present embodiment, the gate trench 24 is formed such that the lengthwise direction of the gate trench 24 is orthogonal to the lengthwise direction of the first deep layer 15. The gate trench 24 is formed to be sandwiched by the second deep layer 18 in the normal direction.

A gate insulation film 25 is formed at an inner wall surface of the gate trench 24. A gate electrode 26 made of doped polycrystalline silicon (Poly-Si) is formed at a surface of the gate insulation film 25. Accordingly, a trench gate structure is formed. The gate electrode 26 is electrically connected to the pad 4 through a gate wiring (not shown).

An interlayer insulation film 27 is formed above the first surface 10a of the semiconductor substrate 10 to cover, for example, the gate electrode 26 and the gate insulation film 25. The interlayer insulation film 27 is made of Borophosphosilicate Glass (BPSG).

A contact hole 27a for exposing the source region 22 and the contact region 23 is formed at the interlayer insulation film 27. The pattern of the contact hole 27a formed at the interlayer insulation film 27 is arbitrary. For example, the pattern may be a pattern with an array of multiple square shapes, a pattern with an array of rectangular linear shapes, or a pattern with aligned linear shapes. In the present embodiment, the contact hole 27a has a linear shape along the lengthwise direction of the gate trench 24.

An upper electrode 28 is formed above the interlayer insulation film 27. The upper electrode 28 is electrically connected to the source region 22 and the contact region 23 through the contact hole 27a. In the present embodiment, the upper electrode 28 corresponds to a first electrode.

The upper electrode 28 according to the present embodiment is made of multiple metals such as Ni/Al. A portion of the multiple metals in contact with at least p-type SiC (in other words, the contact region 23) is made of a metal capable of making an ohmic contact with the p-type SiC.

As illustrated in FIG. 1, the lower electrode 29 electrically connected to the substrate 11 is formed at the second surface 10b of the semiconductor substrate 10. In the present embodiment, the lower electrode 29 corresponds to a second electrode. In the SiC semiconductor device according to the present embodiment, with such a structure, MOSFET of an n-channel type inverted trench gate structure is formed at the cell region 1.

The cell region 1 is formed as described above. The following describes the temperature detection region 2. As illustrated in FIG. 3, in the temperature detection region 2, the JFET portion 14 and the first deep layer 15 are formed above the low-concentration layer 13. The JFET portion 14 in the temperature detection region 2 has a thickness identical to the JFET portion 14 between the first deep layer 15 and the low-concentration layer 13 in the cell region 1, and is formed over the entire low-concentration layer 13. The first deep layer 15 is formed above the entire JFET portion 14. In other words, in the temperature detection region 2, the first deep layer 15 is stacked on the JFET portion 14.

As similar to the current dispersion layer 17 formed in the cell region 1, the current dispersion layer 17 is entirely formed above the first deep layer 15. As similar to the base layer 21 formed in the cell region 1, the base layer 21 is formed above the current dispersion layer 17. A diode element 40 as a temperature detection element has a $p^+$-type anode layer 41 and an $n^+$-type cathode layer 42, and the anode layer 41 and the cathode layer 42 are connected in the planar direction of the semiconductor substrate 10. The diode element 40 is formed at the surface layer portion of the base layer 21. In the present embodiment, the anode layer 41 corresponds to a second constituent layer, and the cathode layer 42 corresponds to a first constituent layer.

The anode layer 41 has a bottom surface closer to the substrate 11 that has a depth identical to the bottom surface of the contact region 23, and has a thickness identical to the contact region 23. The anode layer 41 has a p-type impurity concentration identical to the contact region 23. The anode layer 41 according to the present embodiment has a thickness identical to the contact region 23 and has an impurity concentration identical to the contact region 23 as described above. Therefore, the anode layer 41 and the contact region 23 are formed in the identical process. In the present embodiment, the contact region 23 and the anode layer 41 are simultaneously formed by ion implantation from the first surface 10a of the semiconductor substrate 10. Therefore, the contact region 23 and the anode layer 41 is made of an ion-implantation layer.

Similarly, the cathode layer 42 has a bottom surface closer to the substrate 11 that has a depth identical to the bottom surface of the source region 22, and has a thickness identical to the source region 22. The cathode layer 42 has an n-type impurity concentration identical to the source region 22. The cathode layer 42 according to the present embodiment has a thickness identical to the source region 22 and has an impurity concentration identical to the source region 22 as described above. Therefore, the cathode layer 42 and the source region 22 are formed in the identical process. In the present embodiment, the source region 22 and the cathode layer 42 are simultaneously formed by ion implantation from the first surface 10a of the semiconductor substrate 10. Therefore, the source region 22 and the cathode layer 42 is made of an ion-implantation layer.

Figure 4:
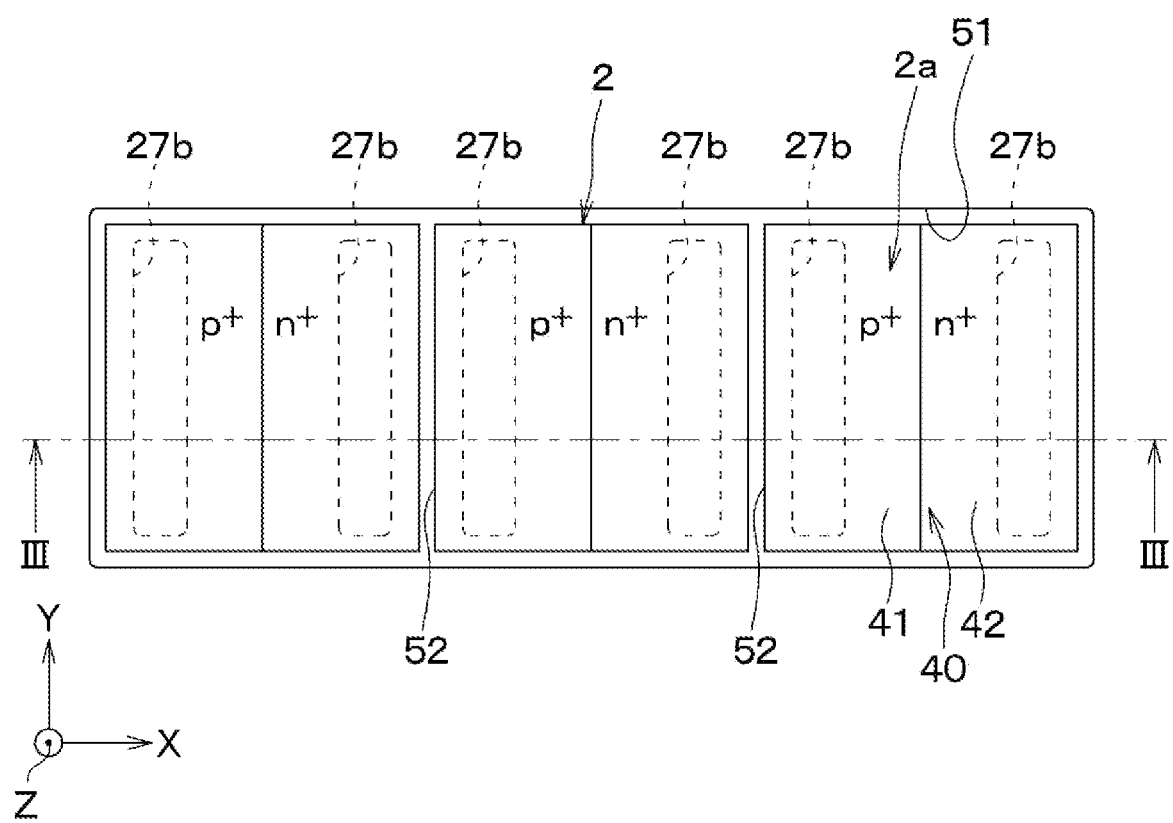
FIG. 4 is a plan view of the temperature detection region shown in FIG. 3.

As illustrated in FIGS. 3, 4, in the present embodiment, a separation trench 51 having a frame shape is formed to surround the temperature detection region 2. In the present embodiment, a region surrounded by the separation trench 51 is defined as the temperature detection region 2. The temperature detection region 2 is separated from the cell region 1 and the peripheral region 3 by the separation trench 51. FIG. 3 also corresponds to a cross-sectional surface taken along a line III-III in FIG. 4.

A partition trench 52 is formed at the temperature detection region 2 according to the present embodiment. The partition trench 2a divides the temperature detection region 2 into several constituent regions 2a. The partition trench 52 is formed to communicate with the separation trench 51, and is formed to have a so-called ladder shape with the separation trench 51. The number of the partition trenches 52 according to the present embodiment is two. Two partition trenches 52 are provided such that the temperature detection region 2 is divided into three constituent regions 2a, and the constituent regions 2a are aligned along the X-axis direction.

Each of the separation trench 51 and the partition trench 52 has a depth identical to the gate trench 24, and the bottom surface of each of the separation trench 51 and the partition trench 52 is located inside the current dispersion layer 17. Therefore, the separation trench 51 and the partition trench 52 are formed simultaneously when the gate trench 24 is formed. Since the separation trench 51 and the partition trench 52 are formed as described above, the JFET portion 14 and the first deep layer 15 are arranged below the bottom surface of each of the separation trench 51 and the partition trench 52.

A gate insulation film 53 and a floating gate electrode 54 are embedded in the separation trench 51 and the partition trench 52. The floating gate electrode 54 is not connected to the pad 4 to which the gate electrode 26 is connected, and is in a floating state. FIG. 4 omits the illustration of the gate insulation film 53 and the floating gate electrode 54.

The anode layer 41 and the cathode layer 42 are formed in each of the constituent regions 2a. According to the present embodiment, in each of the constituent regions 2a, the anode layer 41 and the cathode layer 42 are formed in order along an arrangement direction of the constituent regions 2a.

As similar to the interlayer insulation film 27 formed in the cell region 1, the interlayer insulation film 27 is formed at the first surface 10a of the semiconductor substrate 10. A contact hole 27b is formed at the interlayer insulation film 27. The contact hole 27b causes the anode layer 41 and the cathode layer 42 to be exposed. The pattern of the contact hole 27b formed at the interlayer insulation film 27 may also be arbitrary as similar to the contact hole 27a. In the present embodiment, the contact hole 27b has a linear shape along the lengthwise direction of the separation trench 51.

A first main electrode 61 and a second main electrode 62 are formed above the interlayer insulation film 27. The first main electrode 61 is connected to the anode layer 41 as one end portion of the diode element 40, and the second main electrode 62 is connected to the cathode layer 42 as the other end portion of the diode element 40. The first main electrode 61 and the second main electrode 62 are electrically connected to the pad 5 through a connection wiring (not shown). A connection electrode 63 is formed above the interlayer insulation film 27. The connection electrode 63 connects the anode layer 41 and the cathode layer 42 formed at each of the constituent regions 2a. In the present embodiment, the anode layer 41 and the cathode layer 42 formed at each of the constituent regions 2a are connected in order through the connection electrode 63 to form the diode element 40 as the temperature detection element.

FIG. 4 omits the illustration of the interlayer insulation film 27 and each of the electrodes 61 to 63, and illustrates a plan view on the first surface 10a of the semiconductor substrate 10 in the temperature detection region 2. In FIG. 4, a portion of the anode layer 41 and the cathode layer 42 connecting the electrodes 61 to 63 through the contact hole 27b is a region surrounded by a dotted line.

Multiple p-type guard rings are included to surround the cell region 1 in the peripheral region 3. The planar layout of the guard ring may be, for example, a quadrangular shape with four rounded corner or a circular shape in the Z-axis direction.

The configuration of the SiC semiconductor device according to the present embodiment is described above. In the present embodiment, the n-type, the $n^+$-type, and the $n^-$-type correspond to a first conductive type, and the p-type, the $p^-$-type, and $p^+$-type correspond to a second conductive type. The following describes the operation and advantageous effects of the SiC semiconductor device.

In the SiC semiconductor device as described above, an inversion layer is not formed in the base layer 21 in an off-state before a gate voltage is applied to the gate electrode 26. For this reason, even if a positive voltage, for example, 1600V is applied to the lower electrode 29, electrons do not flow into the base layer 21 from the source region 22. The SiC semiconductor device is turned to the off-state in which the current does not flow between the upper electrode 28 and the lower electrode 29.

In a case where the SiC semiconductor device is in the off-state, an electrical field is applied between the drain and gate, and the electrical field concentration occurs at the bottom portion of each of the gate insulation films 25, 53. In the SiC semiconductor device, the first deep layer 15 and the JFET portion 14 are respectively provided at positions deeper than the gate trench 24, the separation trench 51 and the partition trench 52. For that reason, a depletion layer formed between the first deep layer 15 and the JFET portion 14 suppresses the rising of equipotential lines due to an influence of the drain voltage, and makes a high electric field difficult to enter the gate insulation films 25, 53. In the present embodiment, it is possible to inhibit the breakdown of the gate insulation films 25, 53 when the SiC semiconductor device is turned off.

When a predetermined gate voltage (for example, 20 V) is applied to the gate electrode 26, a channel is provided in the surface of the base region 21 which is in contact with the gate trench 24. As a result, a current flows between the upper electrode 28 and the lower electrode 29, and the SiC semiconductor device is turned on. In the present embodiment, since the electrons having passed through the channels pass through the current dispersion layer 17, the JFET portion 14 and the low-concentration layer 13, it is conceivable that the drift layer 19 includes the current dispersion layer 17, the JFET portion 14 and the low-concentration layer 13.

Figure 5:
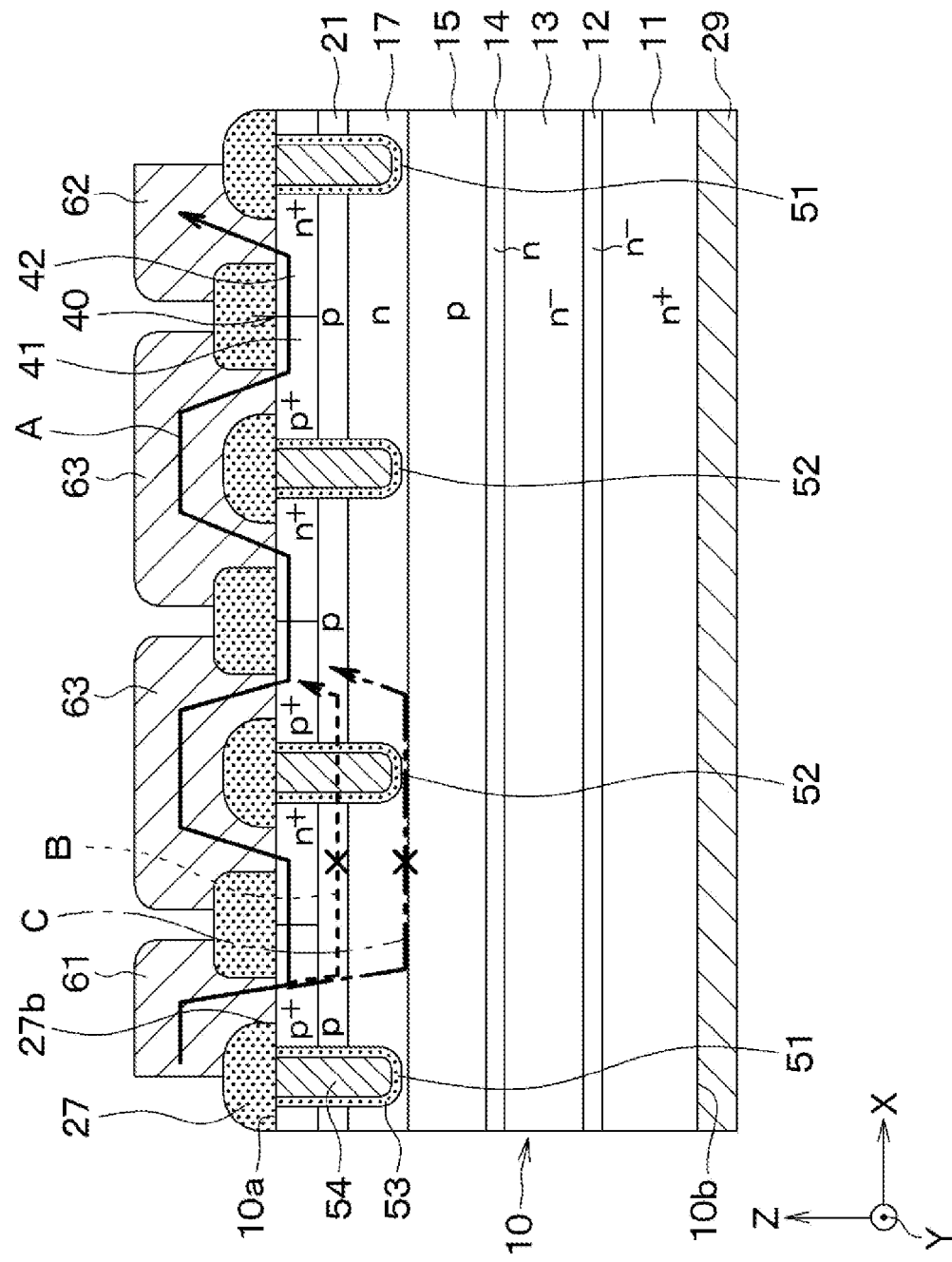
FIG. 5 illustrates a detection state of a diode element.

In the temperature detection region 2, a constant current flows through the diode element 40 as shown by an arrow A in FIG. 5. The temperature of the semiconductor substrate 10 changes according to the switching operation in the cell region 1 or the surrounding environment. In this case, the voltage of the diode element 40 in a forward direction changes depending on the temperature of the semiconductor substrate 10. In the above-described SiC semiconductor device, the temperature of the semiconductor substrate 10 is detected based on the voltage of the diode element 40 in the forward direction.

In this case, in the present embodiment, the temperature detection region 2 are separated from the cell region 1 and the peripheral region 3 by the separation trench 51. For this reason, it is possible to inhibit the flow of current from the cell region 1 to the temperature detection region 2, and inhibit a decrease in the detection precision.

In the present embodiment, the temperature detection region 2 are divided into multiple constituent regions 2a. As shown by an arrow B in FIG. 5, a leakage current flowing from the anode layer 41 to another anode layer 41 through the base layer 21 is less likely to occur. It is possible to further inhibit the variation of the voltage in the forward direction, and further inhibit a decrease in the detection precision.

In the temperature detection region 2, the n-type current dispersion layer 17 is arranged between the p-type base layer 21 and the p-type first deep layer 15. As shown by an arrow C in FIG. 5, the leakage current again flowing to the base layer 21 through the anode layer 41, the base layer 21 and the current dispersion layer 17 is less likely to occur. It is possible to further inhibit the variation of the voltage in the forward direction, and further inhibit a decrease in the detection precision.

According to the present embodiment as described above, the diode element 40 includes the anode layer 41 and the cathode layer 42 formed at the surface layer portion of the base layer 21. For example, it is possible to easily form the anode layer 41 and the cathode layer 42 through ion implantation, and easily modify the impurity concentration and depth. Therefore, it is possible to enhance the degree of freedom in designing the SiC semiconductor device.

In the present embodiment, the anode layer 41 has an impurity concentration and depth identical to the contact region 23, and the cathode layer 42 has an impurity concentration and depth identical to the source region 22. Thus, it is possible to form the anode layer 41 and the contact region 23 in the same process, and it is possible to form the cathode layer 42 and the source region 22 in the same process. It is possible to form the SiC semiconductor device having the diode element 40 as the temperature detection element without increasing the number of steps in the manufacturing process. In other words, the structure of the SiC semiconductor device can be simplified.

In the present embodiment, the temperature detection region 2 are separated from the cell region 1 and the peripheral region 3 by the separation trench 51. For this reason, it is possible to inhibit the flow of current from the cell region 1 to the temperature detection region 2, and inhibit a decrease in the detection precision.

In the present embodiment, the temperature detection region 2 are divided into multiple constituent regions 2a. For this reason, the leakage current flowing from the anode layer 41 to another anode layer 41 through the base layer 21 is less likely to occur. It is possible to further inhibit the variation of the voltage in the forward direction, and further inhibit a decrease in the detection precision.

In the present embodiment, in the temperature detection region 2, the n-type current dispersion layer 17 is arranged between the p-type base layer 21 and the p-type first deep layer 15. For this reason, the leakage current again flowing to the base layer 21 through the anode layer 41, the base layer 21 and the current dispersion layer 17 is less likely to occur. It is possible to further inhibit the variation of the voltage in the forward direction, and further inhibit a decrease in the detection precision.

In the present embodiment, the separation trench 51 and the partition trench 52 respectively have the same depths as the gate trench 24. Therefore, the separation trench 51 and the partition trench 52 can be formed with the gate trench 24 in the same process, and it is possible to inhibit an increase in the number of steps in the manufacturing process.

In the present embodiment, the anode layer 41 and the cathode layer 42 are formed at the semiconductor substrate 10 to form the diode element 40. Therefore, the temperature responsiveness can be enhanced as compared with the case where p-type polysilicon and n-type polysilicon or the like are arranged above the first surface 10a of the semiconductor substrate 10 through the insulation film.

Second Embodiment

The following describes a second embodiment. The present embodiment includes an extraction portion, whereas the first embodiment does not have the extraction portion. The other configurations are the same as those of the first embodiment, and therefore a description of the same configurations will be omitted below.

Figure 6:
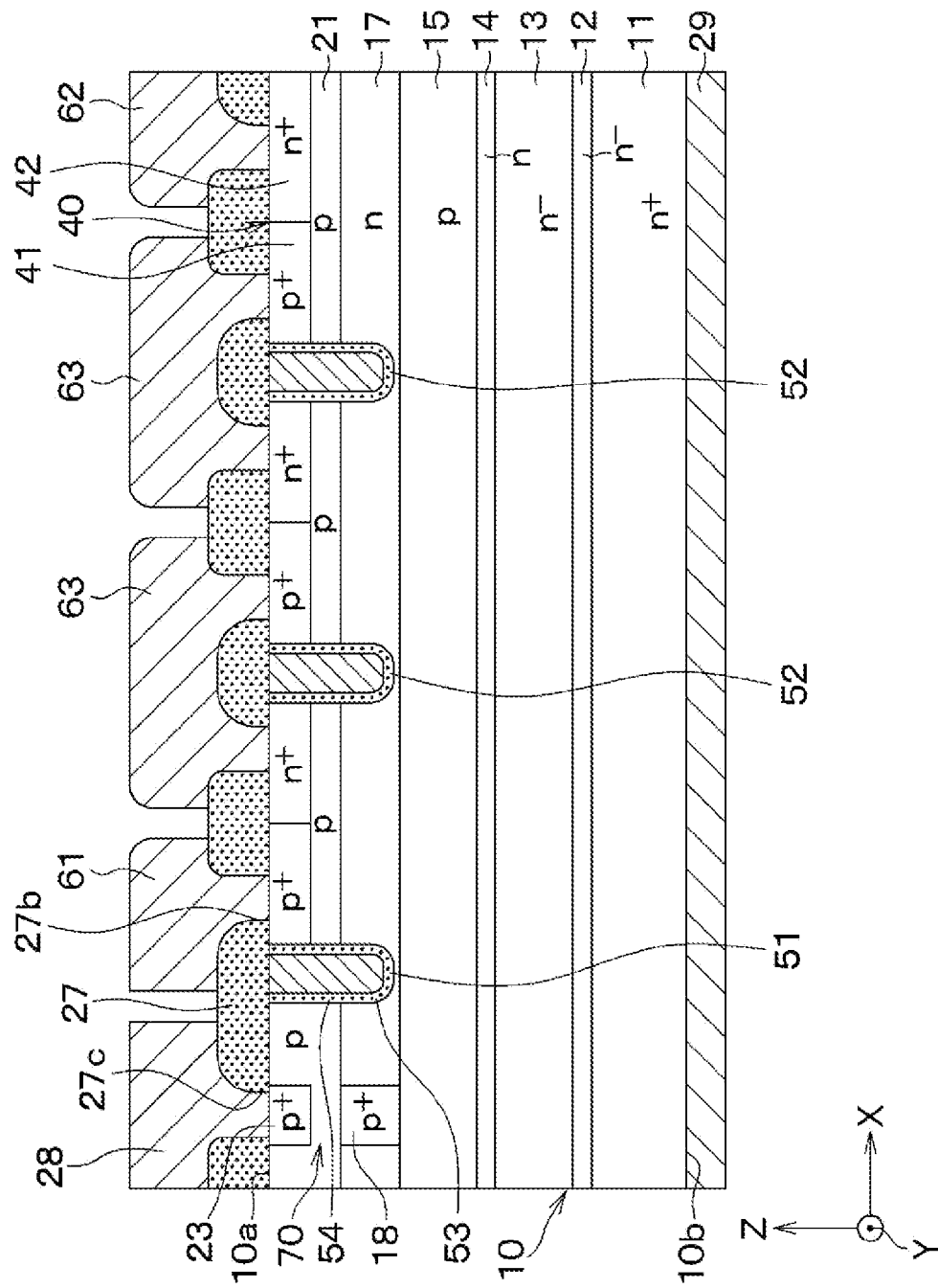
FIG. 6 is a cross-sectional view of a temperature detection region according to a second embodiment.
Figure 7:
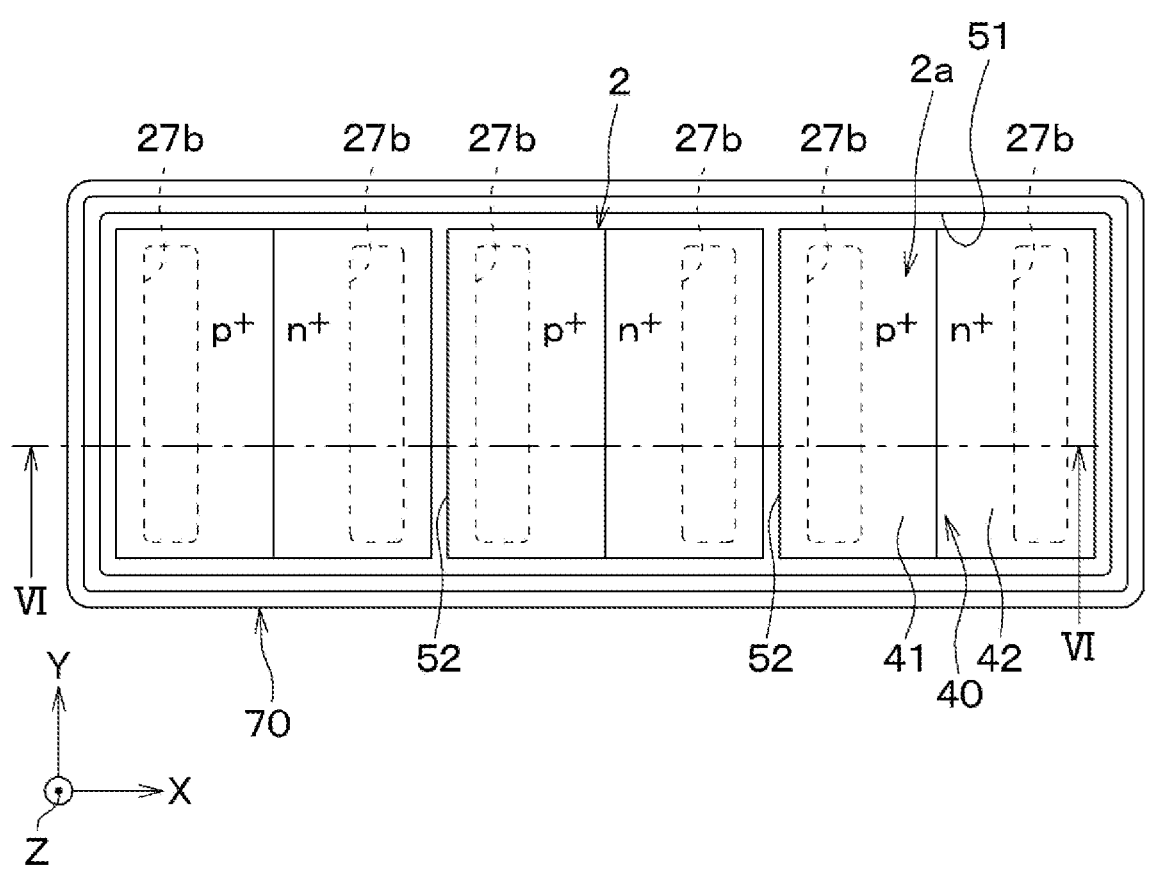
FIG. 7 is a plan view of the temperature detection region shown in FIG. 6.

In a SiC semiconductor device according to the present embodiment, an extraction portion 70 is formed as shown in FIGS. 6, 7. The extraction portion 70 according to the present embodiment includes a portion arranged between the cell region 1 and the temperature detection region 2, and the planar shape of the extraction portion 70 has a frame shape for surrounding the separation trench 51. The extraction portion 70 is formed by forming the second deep layer 18 as identical to the one in the cell region 1 to connect the first deep layer 15 at the temperature detection region 2, and forming the contact region 23 connected to the second deep layer 18 at the surface layer portion of the base layer 21 through the base layer 21. The extraction portion 70 is made of a p-type layer connected to the first deep layer 15. FIG. 6 corresponds to a cross-sectional view taken along the line IV-IV in FIG. 7.

A contact hole 27c for exposing the contact region 23 included in the extraction portion 70 is formed at the interlayer insulation film 27. The contact region 23 included in the extraction portion 70 is electrically connected to the upper electrode 28 through the contact hole 27c. As a result, the first deep layer 15 of the temperature detection region 2 is electrically connected to the upper electrode 28 through the extraction portion 70. In other words, the extraction portion 70 according to the present embodiment connects the first deep layer 15 and the upper electrode 28 at the temperature detection region 2.

According to the present embodiment as described above, the diode element 40 includes the anode layer 41 and the cathode layer 42. The anode layer 41 has an impurity concentration and thickness identical to the contact region 23, and the cathode layer 42 has an impurity concentration and thickness identical to the source region 22. Therefore, the same effects as those of the first embodiment can be obtained.

In the present embodiment, the first deep layer 15 at the temperature detection region 2 is electrically connected to the upper electrode 28 through the extraction portion 70. The extraction portion 70 is formed at a position closer to the upper electrode 28 in the cell region 1. For this reason, it is possible to extract a surge current caused by holes from the first deep layer 16 to the upper electrode 28 through the extraction portion 70, when an avalanche breakdown or the like occurs. It is possible to prevent the surge current from reaching the diode element 40 in order to protect the diode element 40.

In the present embodiment, the extraction portion 70 is formed to surround the temperature detection region 2. Therefore, it is possible to efficiently extract the surge current, as compared with the case where the extraction portions 70 are scattered around the temperature detection region 2.

In the present embodiment, the extraction portion 70 is formed by the contact region 23 and the second deep layer 18 identical to the ones in the cell region 1. Therefore, the process for only manufacturing the extraction portion 70 is not necessary, so that it is possible to inhibit an increase in the number of steps in the manufacturing process.

Third Embodiment

The following describes a third embodiment. In the present embodiment, the location for forming the extraction portion 70 is modified from the second embodiment. Descriptions of the same configurations and processes as those of the second embodiment will not be repeated hereinafter.

Figure 8:
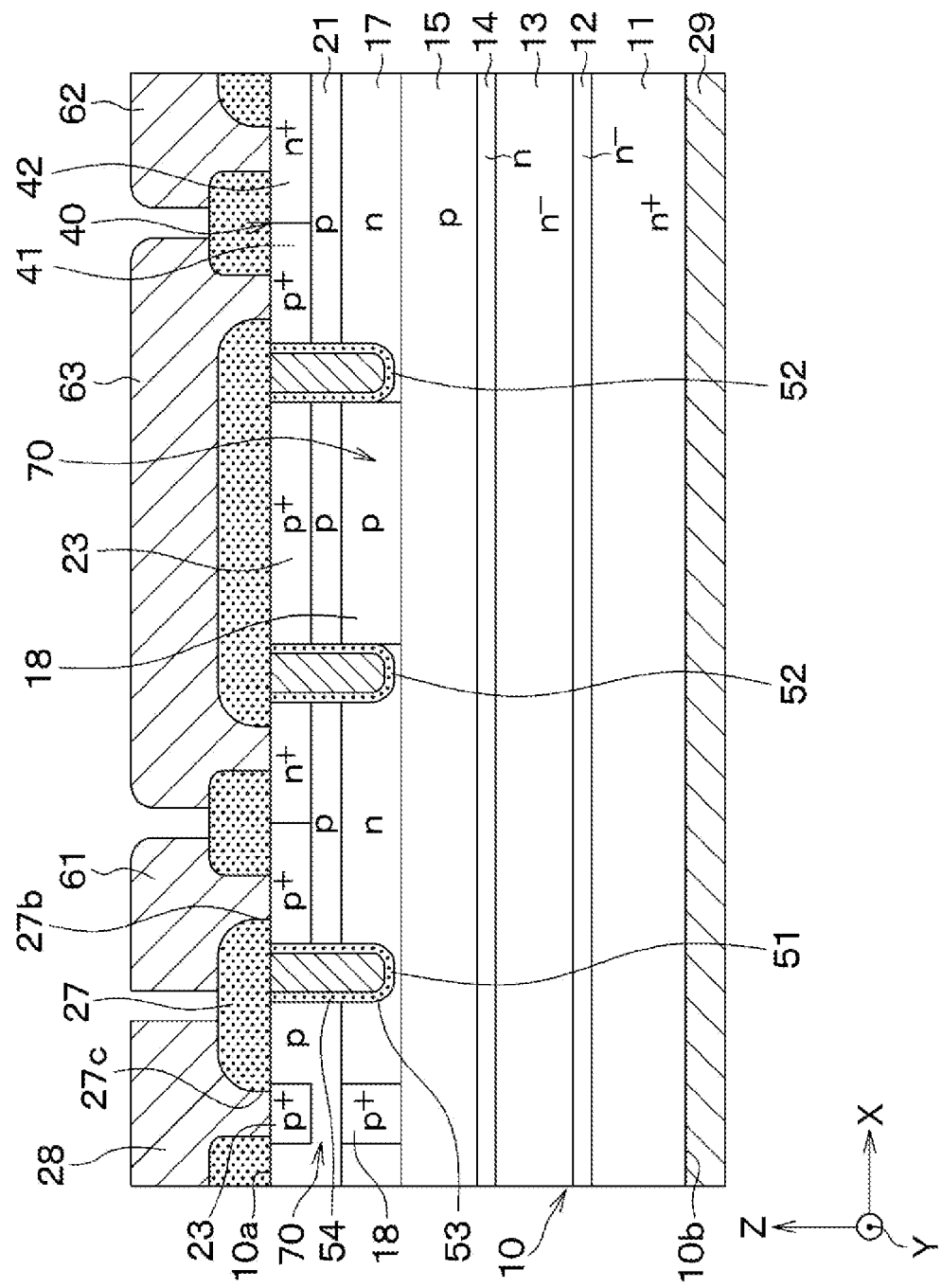
FIG. 8 is a cross-sectional view of a temperature detection region according to a third embodiment.
Figure 9:
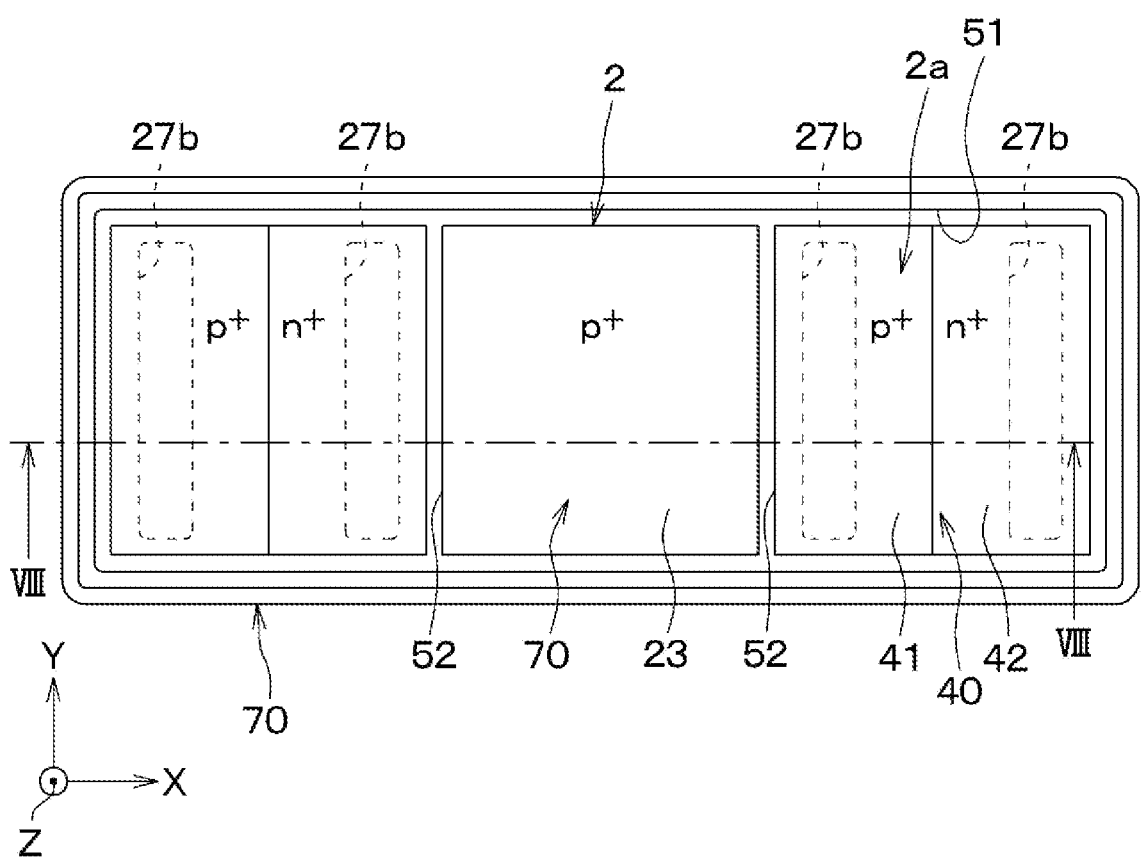
FIG. 9 is a plan view of the temperature detection region shown in FIG. 8.

In a SiC semiconductor device according to the present embodiment, the extraction portion 70 is formed in the temperature detection region 2 as shown in FIGS. 8, 9. In the present embodiment, the temperature detection region 2 is in a state in which three constituent regions 2a are aligned side by side along the X-axis direction. The extraction portion 70 is formed at the central constituent region 2a as one of the three constituent regions 2a. The extraction portion 70 arranged in the temperature detection region 2 is electrically connected to the upper electrode 28 in a cross-sectional surface different from FIG. 8. FIG. 8 also corresponds to a cross-sectional surface taken along a line VIII-VIII in FIG. 9.

According to the present embodiment as described above, the diode element 40 includes the anode layer 41 and the cathode layer 42. The anode layer 41 has an impurity concentration and thickness identical to the contact region 23, and the cathode layer 42 has an impurity concentration and thickness identical to the source region 22. Therefore, the same effects as those of the first embodiment can be obtained.

In the present embodiment, the extraction portion 70 is arranged in the temperature detection region 2. It is possible to further prevent the surge current from reaching the diode element 40 in order to further protect the diode element 40.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

In the above-described embodiments, the MOSFET with the n-channel type trench gate structure in which the first conductivity type is n-type and the second conductivity type is p-type has been described as an example of the SiC semiconductor device. The MOSFET is formed at the cell region 1. However, the semiconductor element formed at the cell region 1 may be appropriately modified. For example, a MOSFET with a trench gate structure of a p-channel type in which the conductivity type of each component is inverted with respect to the n-channel type may also be used. The semiconductor element formed at the cell region 1 may be formed with an IGBT with an identical structure other than the MOSFET. In the case of IGBT, the $n^+$-type drain region, in other words, the substrate 11 in each of the embodiments is modified to the $p^+$-type contact region. Other than that, IGBT is similar to the MOSFET as described in the first embodiment.

In the embodiments as described above, the partition trench 52 may not be formed, and the separation trench 51 may not be formed. The separation trench 51 and the partition trench 52 may not respectively have the same depths as the gate trench 24.

Each of the above embodiments describes that the first deep layer 15 extends along the X-axis direction. However, the first deep layer 15 may extend along the Y-axis direction.

In each of the embodiments, the JFET portion 14, the first deep layer 15, the current dispersion layer 17, the second deep layer 18 or the like may not have to be included, and the drift layer 19 may only have the low-concentration layer 13.

In the embodiments as described above, the anode layer 41 may have a thickness different from the contact region 23, and may have an impurity concentration different from the contact region 23. Similarly, the cathode layer 42 may have a thickness different from the source region 22, and may have an impurity concentration different from the source region 22.

What is claimed is:
1. A silicon carbide semiconductor device comprising:
a substrate having a first conductivity type or a second conductivity type, the substrate made of silicon carbide, the substrate including
a cell region at which a semiconductor element is disposed, and
a temperature detection region at which a diode element configured as a temperature detection element is disposed;
a drift layer having the first conductivity type, the drift layer disposed above the substrate and having an impurity concentration lower than an impurity concentration of the substrate;
a base layer having the second conductivity type, the base layer disposed above the drift layer;
a first electrode disposed at a side facing the substrate with the drift layer sandwiched between the substrate and the first electrode, the first electrode electrically connected to the semiconductor element included in the cell region; and
a second electrode disposed at a side facing the drift layer with the substrate sandwiched between the drift layer and the second electrode, the second electrode electrically connected to the semiconductor element included in the cell region,
wherein the semiconductor element disposed at the cell region includes:
a first impurity region that has the first conductivity type and is disposed at a surface layer portion of the base layer;

a second impurity region that has the second conductivity type and is disposed at the surface layer portion of the base layer, and
an extraction portion of the second conductivity type located in the temperature detection region,
wherein the first impurity region and the second impurity region are connected to the first electrode,
wherein the diode element disposed at the temperature detection region includes:
a first constituent layer that has the first conductivity type and is disposed at the surface layer portion of the base layer; and
a second constituent layer that has the second conductivity type and is disposed at the surface layer portion of the base layer, and that is connected to the first constituent layer over a plane direction of the substrate, and
wherein, as viewed in a direction perpendicular to a top surface of the substrate, only one side of the first constituent layer is in contact with the second constituent layer.

2. The silicon carbide semiconductor device according to claim 1,
wherein the first constituent layer has a thickness identical to a thickness of the first impurity region, and has an impurity concentration identical to an impurity concentration of the first impurity region, and
wherein the second constituent layer has a thickness identical to a thickness of the second impurity region, and has an impurity concentration identical to an impurity concentration of the second impurity region.

3. The silicon carbide semiconductor device according to claim 1, further comprising:
a separation trench disposed to be deeper than the base layer to reach the drift layer, the separation trench surrounding the temperature detection region.

4. The silicon carbide semiconductor device according to claim 3, further comprising:
a partition trench connected to the separation trench, the partition trench dividing the temperature detection region into a plurality of constituent regions, and
wherein the first constituent layer and the second constituent layer are included in each of at least two of the constituent regions.

5. The silicon carbide semiconductor device according to claim 4, further comprising:
a trench gate structure disposed at the cell region, the trench gate structure including
a gate trench disposed to be deeper than the base layer to reach the drift layer, the gate trench having a side surface in contact with the base layer and the first impurity region,
a gate insulation film disposed at a wall surface of the gate trench, and
a gate electrode disposed above the gate insulation film,
wherein each of the separation trench and the partition trench has a depth identical to a depth of the gate trench.

6. The silicon carbide semiconductor device according to claim 1,
wherein the cell region includes:
a low-concentration layer having the first conductivity type and disposed above the substrate, the low-concentration layer having an impurity concentration lower than the impurity concentration of the substrate;
a first deep layer having the second conductivity type and disposed above the low-concentration layer, the first deep layer having a plurality of linear portions, each of the linear portions having a lengthwise direction in a direction parallel to the plane direction of the substrate;
a junction field effect transistor (JFET) portion having the first conductivity type and disposed above the low-concentration layer, the JFET portion having a linear portion sandwiched by the first deep layer;
a current dispersion layer having the first conductivity type and disposed above the JFET portion, the current dispersion layer having an impurity concentration higher than the impurity concentration of the low-concentration layer;
a second deep layer having the second conductivity type and disposed above the first deep layer; and
the base layer disposed above the current dispersion layer and the second deep layer,
wherein the drift layer includes the low-concentration layer, the JFET portion and the current dispersion layer, and
wherein the temperature detection region includes:
the low-concentration layer disposed above the substrate;
the first deep layer having the second conductivity type and disposed above the low-concentration layer;
the current dispersion layer disposed above the first deep layer; and
the base layer disposed above the current dispersion layer.

7. The silicon carbide semiconductor device according to claim 6,
Wherein the first deep layer at the temperature detection region is electrically connected to the first electrode through the extraction region.

8. The silicon carbide semiconductor device according to claim 7,
wherein the extraction portion includes a section between the temperature detection region and the cell region, and has a frame shape to surround the temperature detection region.

* * * * *